United States Patent
Lee et al.

(10) Patent No.: US 10,203,391 B2
(45) Date of Patent: Feb. 12, 2019

(54) MAGNETIC RESONANCE IMAGING APPARATUS AND METHOD OF OPERATING THE SAME

(71) Applicant: SAMSUNG ELECTRONICS CO., LTD., Suwon-si (KR)

(72) Inventors: Dae-ho Lee, Seongnam-si (KR); Sang-young Zho, Suwon-si (KR); Yang-lim Choi, Seongnam-si (KR); Jae-moon Jo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 583 days.

(21) Appl. No.: 14/845,619

(22) Filed: Sep. 4, 2015

(65) Prior Publication Data
US 2016/0069974 A1 Mar. 10, 2016

(30) Foreign Application Priority Data
Sep. 5, 2014 (KR) .......... 10-2014-0119360

(51) Int. Cl.
*G01R 33/483* (2006.01)
*G01R 33/561* (2006.01)

(52) U.S. Cl.
CPC ...... *G01R 33/5611* (2013.01); *G01R 33/4835* (2013.01)

(58) Field of Classification Search
CPC .......... G01R 33/5611; G01R 33/4835
USPC .......... 324/309
See application file for complete search history.

(56) References Cited

U.S. PATENT DOCUMENTS

| | | |
|---|---|---|
| 7,002,344 B2 | 2/2006 | Griswold et al. |
| 8,405,395 B2 | 3/2013 | Setsompop et al. |
| 2002/0171422 A1 | 11/2002 | King |
| 2009/0278538 A1 | 11/2009 | Chen et al. |
| 2010/0171499 A1 | 7/2010 | Sharp et al. |
| 2011/0084693 A1 | 4/2011 | Kholmovski et al. |
| 2013/0278263 A1 | 10/2013 | Huang et al. |
| 2014/0132264 A1 | 5/2014 | Kim et al. |

FOREIGN PATENT DOCUMENTS

JP 2009-268891 A 11/2009

OTHER PUBLICATIONS

Communication dated Oct. 29, 2015 issued by the International Searching Authority in counterpart International Patent Application No. PCT/KR2015/007771.
Communication dated Dec. 7, 2015 issued by the Korean Intellectual Property Office in counterpart Korean Patent Application No. 10-2014-0119360.

(Continued)

*Primary Examiner* — Reena Aurora
(74) *Attorney, Agent, or Firm* — Sughrue Mion, PLLC

(57) ABSTRACT

The MRI apparatus includes: a radio frequency (RF) transmitter configured to transmit an RF signal including multiple frequency signals corresponding respectively to multiple slices of an object to excite the multiple slices of the object; a gradient amplifier configured to apply a three-dimensional (3D) spatial encoding; an RF receiver configured to receive MR signals in an overlapped state from the multiple slices in a same repetition time (TR) period; and an image processor configured to acquire 3D k-space data based on the MR signals and acquire an MR image of each of the multiple slices based on the 3D k-space data.

32 Claims, 7 Drawing Sheets

(56) References Cited

OTHER PUBLICATIONS

Communication dated Jun. 1, 2016, issued by the Korean Intellectual Property Office in counterpart Korean Application No. 10-2014-0119360.
Communication dated Aug. 9, 2016, issued by the Korean Intellectual Property Office in counterpart Korean Application No. 10-2014-0119360.
Communication dated Apr. 3, 2018 issued by the European Patent Office in counterpart European Patent Application No. 15838111.1.
Benjamin Zahneisen et al., "Three-Dimensional Fourier Encoding of Simultaneously Excited Slices: Generalized Acquisition and Reconstruction Framework", Magnetic Resonance in Medicine, Jul. 22, 2013, pp. 2071-2081, vol. 71, No. 6, XP055436730, DOI: 10,1002/mrm.24875.
Kangrong Zhu et al., "Autocalibrating CAIPIRINHA: Reformulating CAIPIRINHA as a 3D Problem", Proceedings of the International Society for Magnetic Resonance in Medicine, 20th Annual Meeting & Exhibition, May 5, 2012, pp. 518, XP040622948.
Office Action dated Sep. 19, 2018 by the Korean Intellectual Property Office in counterpart Korean Patent Application No. 10-2014-0119360.

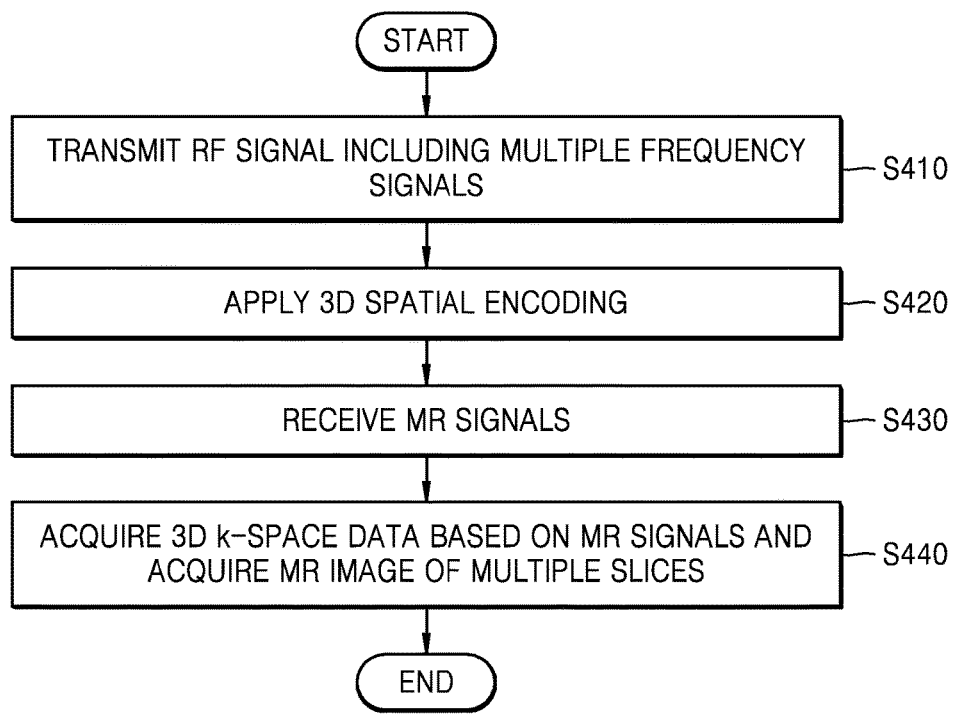
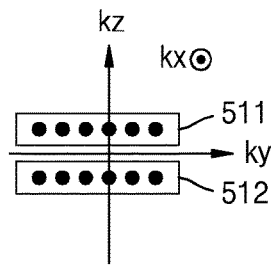
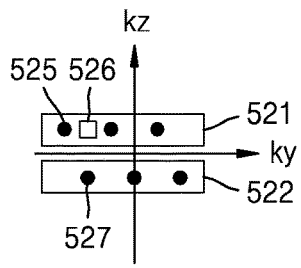
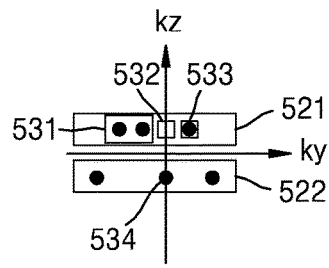

3D Gradient Echo

3D Spin Echo

FIG. 9A
FIG. 9B
● Acquired Line
○ Unacquired Line
◉ Calibration Line
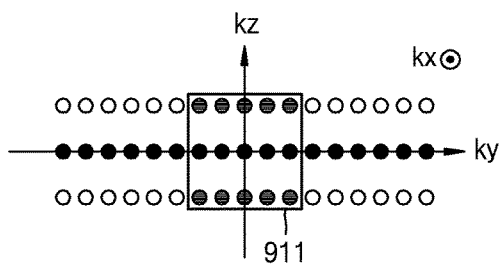
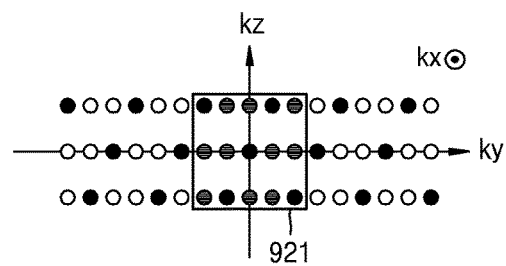

MAGNETIC RESONANCE IMAGING APPARATUS AND METHOD OF OPERATING THE SAME

CROSS-REFERENCE TO RELATED APPLICATION

This application claims priority from Korean Patent Application No. 10-2014-0119360, filed on Sep. 5, 2014, in the Korean Intellectual Property Office, the disclosure of which is incorporated herein in its entirety by reference.

BACKGROUND

1. Field

Apparatuses and methods consistent with exemplary embodiments relate to magnetic resonance imaging (MRI) apparatuses and methods of operating the same, and more particularly, to acquiring an MR image by three-dimensional (3D) spatial encoding by simultaneously acquiring MR signals of multiple slices of an object.

2. Description of the Related Art

Magnetic resonance imaging presents an image by using information that is acquired through resonance after exposing an atomic nucleus to a magnetic field. Resonance of an atomic nucleus refers to a phenomenon in which when a specific high frequency wave is input to an atomic nucleus magnetized by an external magnetic field, the atomic nucleus having a low energy state is excited to a high energy state by absorbing high-frequency energy. Different types of atomic nucleuses respectively have different resonance frequencies, and resonance is influenced by the intensity of an external magnetic field. Numerous atomic nucleuses are present in a human body, and hydrogen nucleuses are generally used for MRI.

For acquisition of magnetic resonance (MR) images, there is a need for technologies capable of processing MR images within a short time.

SUMMARY

One or more exemplary embodiments provide MRI apparatuses and methods of operating the same, which may acquire an MR image through 3D encoding by simultaneously exciting multiple slices of an object.

According to one or more exemplary embodiments, an MRI apparatus includes: a radio frequency (RF) transmitter configured to transmit an RF signal including multiple frequency signals corresponding respectively to multiple slices of an object to excite the multiple slices of the object; a gradient amplifier configured to apply a 3D spatial encoding gradient magnetic field; an RF receiver configured to receive MR signals in an overlapped state from each of the multiple slices in a same repetition time (TR) period; and an image processor configured to acquire 3D k-space data based on the MR signals and acquire an MR image of each of the multiple slices based on the 3D k-space data.

The 3D spatial encoding gradient magnetic field may include: a slice-direction gradient magnetic field; a frequency-direction gradient magnetic field; and a phase-direction gradient magnetic field.

The gradient amplifier may not apply the phase-direction gradient magnetic field in a signal acquisition period for acquiring the MR signals.

The gradient amplifier may not apply the slice-direction gradient magnetic field in a signal acquisition period for acquiring the MR signals.

The gradient amplifier may apply at least one of the slice-direction gradient magnetic field and the phase-direction gradient magnetic field in a signal acquisition period for acquiring the MR signals.

The gradient amplifier may determine an order of applying the slice-direction gradient magnetic field and the phase-direction gradient magnetic field.

The number of times of encoding of the MR signals by the slice-direction gradient magnetic field may be more than the number of the multiple slices.

The RF receiver may acquire additional calibration data from the object by multiple coils, and the image processor may acquire the MR image based on the additional calibration data and the 3D k-space data.

The additional calibration data may be acquired based on the MR signals received in the overlapped state in the same TR period.

The additional calibration data may be acquired based on the MR signals from each of the multiple slices that are additionally excited.

The RF receiver may under-sample and acquire the MR signals by the multiple coils.

The image processor may interpolate multiple k-space data acquired respectively by each of the multiple coils by using the additional calibration data, and acquire an MR image for each of the multiple coils based on the interpolated multiple k-space data.

The image processor may acquire sensitivity information about each of the multiple coils by using the additional calibration data, and acquire the MR image by using the sensitivity information.

The gradient amplifier may apply the 3D spatial encoding gradient magnetic field so that the MR signals have linear phase in a slice direction.

The image processor may acquire the MR image of each of the multiple slices based on the MR signals in the overlapped state by using at least one of parallel imaging and compressed sensing.

According to one or more exemplary embodiments, an MRI apparatus includes: an RF transmitter configured to transmit an RF signal including multiple frequency signals corresponding respectively to multiple slices of an object to excite the multiple slices of the object; a gradient amplifier configured to apply a gradient magnetic field including a frequency-direction gradient magnetic field and a phase-direction gradient magnetic field for spatial encoding; an RF receiver configured to receive MR signals in an overlapped state from each of the multiple slices in a same TR period; and an image processor configured to acquire 3D k-space data based on the MR signals and acquire an MR image of each of the multiple slices based on the 3D k-space data, wherein the RF signal includes a phase shift for spatial encoding in a slice direction.

According to one or more exemplary embodiments, an MRI method includes: transmitting an RF signal including multiple frequency signals corresponding respectively to multiple slices of an object to excite the multiple slices of the object; applying a 3D spatial encoding gradient magnetic field; receiving MR signals in an overlapped state from each of the multiple slices in a same TR period; and acquiring 3D k-space data based on the MR signals and acquiring an MR image of each of the multiple slices of the 3D k-space data.

BRIEF DESCRIPTION OF THE DRAWINGS

The above and/or other aspects will become more apparent by describing certain exemplary embodiments with reference to the accompanying drawings, in which:

FIG. 4 is a flowchart of an MRI method according to an exemplary embodiment;

FIG. 5A is a diagram illustrating an exemplary embodiment of full-sampling of an MR signal;

FIG. 5B is a diagram illustrating an exemplary embodiment of cross-sampling that is a type of under-sampling;

FIG. 5C is a diagram illustrating an exemplary embodiment of random-sampling that is a type of under-sampling;

FIGS. 9A and 9B are diagrams illustrating acquisition of additional calibration data according to another exemplary embodiment.

DETAILED DESCRIPTION

Figure 1:
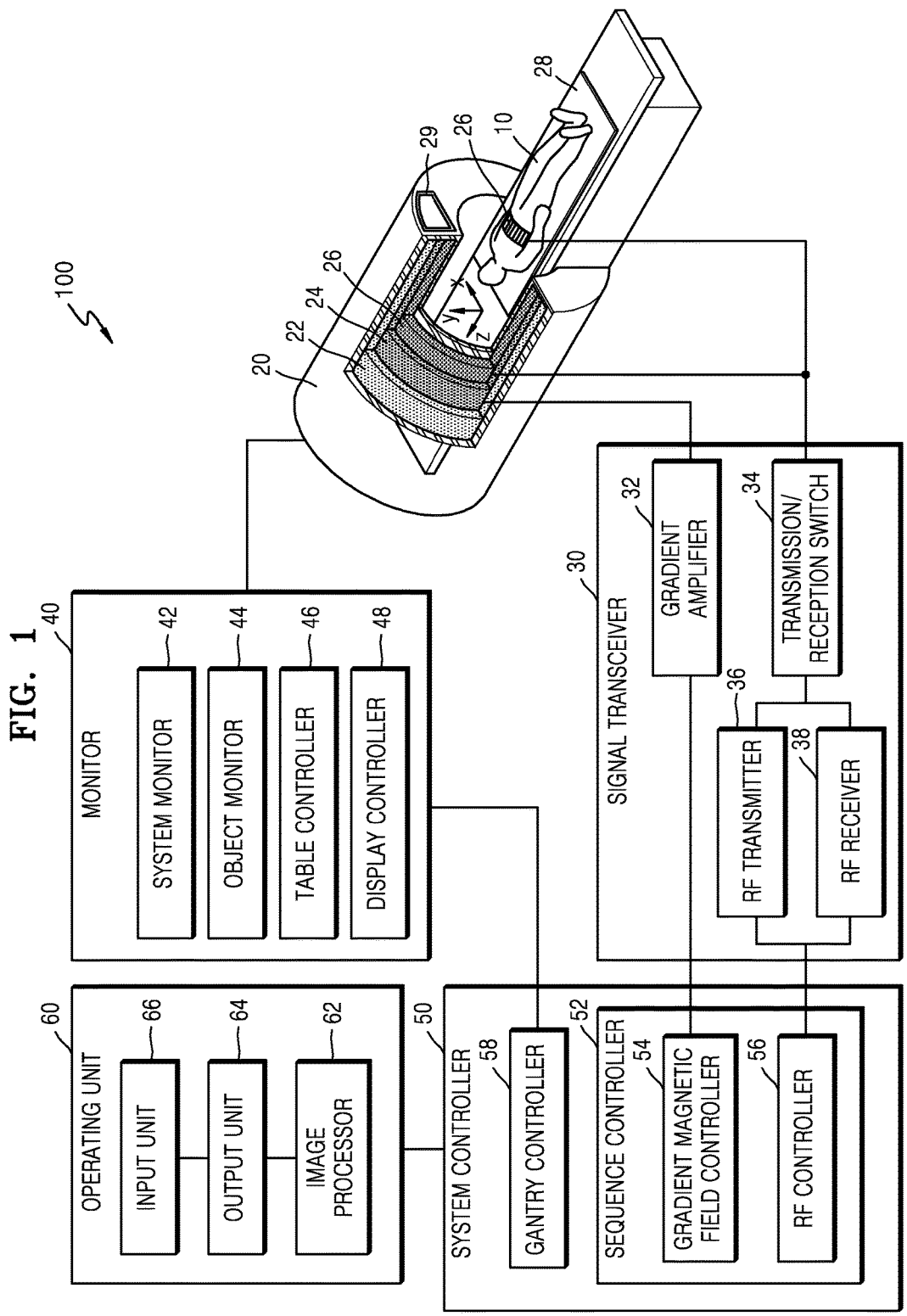
FIG. 1 is a block diagram of an MRI apparatus according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments may be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

When a part "includes" or "comprises" an element, unless there is a particular description contrary thereto, the part can further include other elements, not excluding the other elements. The term "unit" in the exemplary embodiments means a software component or hardware component such as a field-programmable gate array (FPGA) or an application-specific integrated circuit (ASIC), and performs a specific function. However, the term "unit" is not limited to software or hardware. The "unit" may be formed to be in an addressable storage medium, or may be formed to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

In the present specification, an "image" may refer to multi-dimensional data composed of discrete image elements (e.g., pixels in a two-dimensional (2D) image and voxels in a 3D image). For example, the image may include a medical image of an object captured by an X-ray apparatus, a computed tomography (CT) apparatus, an MRI apparatus, an ultrasound diagnosis apparatus, or any other medical imaging apparatus.

Also, in the present specification, an "object" may include a human, an animal, or a part of a human or animal. For example, the object may include an organ, such as a liver, a heart, a womb, a brain, a breast, or an abdomen, a blood vessel, or any combination thereof. The "object" may include a phantom. The phantom denotes a material having a volume that is very close to a density of organisms and an effective atomic number, and may include a spherical phantom having a temper similar to a human body.

Also, in the present specification, a "user" may be, but is not limited to, a medical expert, such as a medical doctor, a nurse, a medical laboratory technologist, or a medical image expert, or an engineer who repairs a medical apparatus.

Also, in the present specification, a "magnetic resonance (MR) image" refers to an image of an object acquired by using the nuclear magnetic resonance principle.

Also, in the present specification, a "pulse sequence" refers to continuation of a repeatedly applied signal in an MRI apparatus. The pulse sequence may include a time parameter of an RF pulse, such as a repetition time (TR) or an echo time (TE).

Also, in the present specification, "TR" may denote a repetition time of an RF pulse. For example, "TR" may denote a time between a transmission time point of a first RF pulse and a transmission time point of a second RF pulse.

Also, in the present specification, a "pulse sequence schematic diagram" illustrates an order of signals applied in an MRI apparatus. For example, the pulse sequence schematic diagram may be a diagram illustrating an RF pulse, a gradient pulse, an MR signal, or the like according to time.

Also, in the present specification, "spatial encoding" may refer to acquiring spatial information along an axis (direction) of a gradient magnetic field by applying a linear gradient magnetic field causing additional proton spin dephasing in addition to proton spin dephasing caused by an RF signal.

An MRI apparatus is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI apparatus may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

The 3D volume of an object may include the 3D shape of a human, an animal, or a portion of a human or animal. For example, the volume of an object may include the 3D shape of an organ, such as a liver, a heart, a womb, a brain, a breast, or an abdomen, or a blood vessel.

In order to acquire information of the 3D volume of the object, multiple slice images may be acquired in the direction of slices constituting the 3D volume. In order to capture images of multiple slices, it is general to sequentially capture multiple slice images, and the number to capture images is equal to the number of slices. Therefore, it may consume more photographing time to sequentially capture the multiple slice images.

In a multi-slice mode, when multiple slice images are respectively acquired in multiple TR periods, the imaging time is reduced by acquiring data about the respective slices alternately in the respective TR periods. For example, when the TR period is longer than an active time necessary for slice selection, phase encoding, or frequency encoding, a dead time exists. Thus, in the multi-slice mode, after information about a slice is acquired in each TR period, information about another slice is acquired in the dead time.

In a simultaneous multi-slice (SMS) mode, in order to reduce a scan time, multiple slices are simultaneously excited to simultaneously acquire MR signals from the multiple slices through multiple coils, and a difference in coil sensitivity information between the slices is used to separate the MR signal of each slice. The coil sensitivity information may represent the sensitivity of receiving different MR signals according to the position of each of the multiple coils.

The SMS mode may correspond to parallel imaging, and the parallel imaging may include a SENSE mode or a GRAPPA mode.

FIG. 1 is a block diagram of an MRI apparatus 100 according to an exemplary embodiment.

Referring to FIG. 1, the MRI apparatus 100 may include a gantry 20, a signal transceiver 30, a monitor 40, a system controller 50, and an operating unit 60.

The gantry 20 includes a main magnet 22, a gradient coil 24, and an RF coil 26. A magnetostatic field and a gradient magnetic field are generated of a bore in the gantry 20, and an RF signal is emitted toward an object 10.

The main magnet 22, the gradient coil 24, and the RF coil 26 may be arranged in a predetermined direction of the gantry 20. The predetermined direction may include a coaxial cylinder direction. The object 10 may be disposed on a table 28 that is capable of being moved into a bore along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating magnetic field gradients in X-, Y-, and Z-axis directions orthogonal to each other. The gradient coil 24 may provide location information of each region of the object 10 by differently inducing resonance frequencies according to the regions of the object 10.

The RF coil 26 may emit an RF signal toward an object and receive an MR signal emitted from the object. In detail, the RF coil 26 may transmit, toward atomic nuclei included in the object and having precessional motion, an RF signal having the same frequency as that of the precessional motion, stop transmitting the RF signal, and then receive an MR signal emitted from the atomic nuclei included in the object.

For example, in order to excite an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Larmor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Larmor frequency. The Larmor frequency may refer to a frequency at which magnetic resonance is induced in the atomic nucleus. The RF coil 26 may receive electromagnetic wave signals from atomic nuclei included in the object 10.

The RF coil 26 may be implemented as a transmit/receive coil having both a function of generating electromagnetic waves each having an RF that corresponds to a type of an atomic nucleus and a function of receiving electromagnetic waves emitted from an atomic nucleus. Alternatively, the RF coil 26 may include a transmit RF coil having a function of generating electromagnetic waves each having an RF that corresponds to a type of an atomic nucleus, and a separate receive RF coil having a function of receiving electromagnetic waves emitted from an atomic nucleus.

The RF coil 26 may be fixed to the gantry 20 or may be detachably attached to the gantry 20. The attachable/detachable RF coil 26 may include an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus in a wired/wireless manner, and may also perform dual tune communication according to a communication frequency band.

The RF coil 26 may include a birdcage coil, a surface coil, or a transverse electromagnetic (TEM) coil according to coil structures.

The RF coil 26 may include RF coils having various numbers of channels such as 16 channels, 32 channels, 72 channels, and 144 channels.

The gantry 20 may further include a display 29 disposed outside the gantry 20 and a display (not shown) disposed inside the gantry 20. The gantry 20 may provide information to the user or the object 10 through the displays respectively disposed outside and inside the gantry 20.

The signal transceiver 30 may control the gradient magnetic field generated inside the gantry 20, i.e., in the bore, according to a MR sequence, and control the transmission/reception of an RF signal and an MR signal.

The signal transceiver 30 may include a gradient amplifier 32, a transmission/reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, magnetic field gradients in X-, Y-, and Z-axis directions may be utilized.

The RF transmitter 36 may supply an RF pulse to the RF coil 26, and the RF receiver 38 may receive an MR signal received by the RF coil 26.

The transmission/reception switch 34 may adjust the transmission/reception directions of the RF signal and the MR signal. For example, the transmission/reception switch 34 may emit the RF signal toward the object 10 through the RF coil 26 during a transmission mode, and receive the MR signal from the object 10 through the RF coil 26 during a reception mode. The transmission/reception switch 34 may be controlled by a control signal output by an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the heart activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be imaged in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and/or the display disposed inside the gantry. Also, when a speaker is located inside or outside the gantry 20, the display controller 48 may control the speaker to be on or off, or may control sound outputted by the speaker.

The system controller 50 may include the sequence controller 52 for controlling a sequence of signals generated in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission/reception switch 34 according to a pulse sequence received from the operating unit 60. The pulse sequence includes information required to control the gradient amplifier 32, the RF transmitter 36, the RF receiver 38, and the transmission/reception switch 34. For example, the pulse sequence may include information about a strength, an application time, and application timing of a pulse signal applied to the gradient coil 24.

The operating unit 60 may request the system controller 50 to transmit pulse sequence information while controlling an overall operation of the MRI apparatus 100.

The operating unit 60 may include an image processor 62 for processing the MR signal received from the RF receiver 38, an output unit 64, and an input unit 66.

The image processor 62 may process the MR signal received from the RF receiver 38 to generate MR image data of the object 10.

The image processor 62 receives the MR signal received by the RF receiver 38 and performs any one of various signal processes, such as amplification, frequency transformation, phase detection, low frequency amplification, and filtering on the received MR signal.

The image processor 62 may arrange digital data in a k-space (for example, also referred to as a Fourier space or a frequency space) of a memory, and reconstruct the digital data into image data by 2D or 3D Fourier transformation.

The image processor 62 may perform a composition process or difference calculation process on image data. The composition process may include an addition process on a pixel or a maximum intensity projection (MIP) process. The image processor 62 may store the reconstructed image data and/or image data on which a composition process or a difference calculation process is performed, in a memory or an external server.

The image processor 62 may perform any of the signal processes on the MR signal in parallel. For example, the image processor 62 may perform a signal process on multiple MR signals received by a multi-channel RF coil in parallel to reconstruct the multiple MR signals into image data.

The output unit 64 may output image data generated or reconstructed by the image processor 62 to the user. The output unit 64 may also output information required for the user to manipulate the MRI apparatus 100, such as a user interface (UI), user information, or object information. The output unit 64 may include a speaker, a printer, a cathode-ray tube (CRT) display, a liquid crystal display (LCD), a plasma display panel (PDP), an organic light-emitting diode (OLED) display, a field emission display (FED), a light-emitting diode (LED) display, a vacuum fluorescent display (VFD), a digital light processing (DLP) display, a flat panel display (FPD), a 3D display, a transparent display, or any one of other various output devices that are known to those of ordinary skill in the art.

The user may input object information, parameter information, a scan condition, a pulse sequence, or information about image composition or difference calculation by using the input unit 66. The input unit 66 may include a keyboard, a mouse, a track ball, a voice recognizer, a gesture recognizer, a touch screen, or any one of other various input devices that are known to those of ordinary skill in the art.

The signal transceiver 30, the monitor 40, the system controller 50, and the operating unit 60 are separate components in FIG. 1, but the respective functions of the signal transceiver 30, the monitor 40, the system controller 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitor 40, the system controller 50, and the operating unit 60 may be connected to each other by wire or wirelessly, and when they are connected wirelessly, the MRI apparatus 100 may further include an apparatus (not illustrated) for synchronizing clock signals therebetween. Communication between the gantry 20, the RF coil 26, the signal transceiver 30, the monitor 40, the system controller 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are known to those of ordinary skill in the art.

Figure 2:
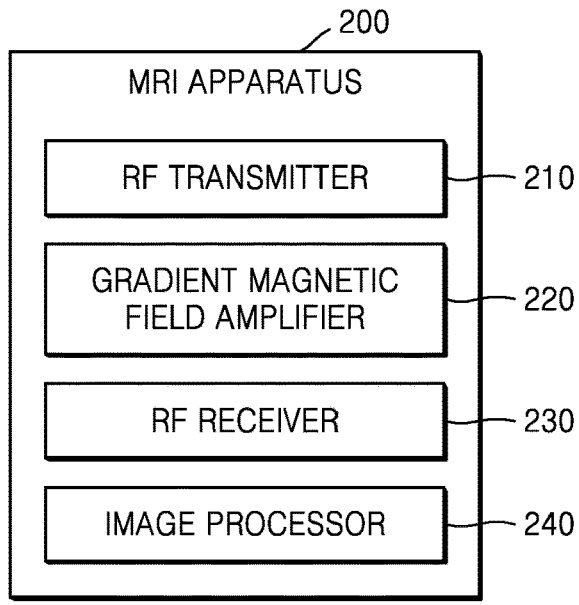
FIG. 2 is a block diagram of an MRI apparatus according to an exemplary embodiment.

Referring to FIG. 2, the MRI apparatus 200 according to an exemplary embodiment may include an RF transmitter 210, a gradient amplifier 220, an RF receiver 230, and an image processor 240.

The RF transmitter 210, the gradient amplifier 220, the RF receiver 230, and the image processor 240 of FIG. 2 may correspond respectively to the RF transmitter 36, the gradient amplifier 32, the RF receiver 38, and the image processor 62 of FIG. 1.

The RF transmitter 210 transmits an RF signal including multiple frequency signals corresponding respectively to multiple slices of an object to excite the multiple slices of the object. The multiple slices of the object may refer to at least two slices among the slices constituting the volume of interest of the object. According to an exemplary embodiment, the gradient amplifier 220 applies a 3D spatial encoding gradient magnetic field to the object, by selecting the slice plane and spatial encoding of each voxel using the magnetic field gradients which are characterized by amplitude (greater or lesser field variation for the same unit of distance), direction, duration, and moment of application. That is, the intensity of the magnetic field may be varied along the gradient application axis.

The gradient amplifier 220 may apply the slice selection gradient in a slice-direction, a frequency encoding gradient in a frequency-direction, and a phase encoding gradient in a phase-direction.

The 3D spatial encoding gradient magnetic field may be embodied by adding a slice-direction gradient magnetic field to a 2D spatial encoding gradient magnetic field including a frequency-direction gradient magnetic field and a phase-direction gradient magnetic field.

In another exemplary embodiment, the gradient amplifier 220 may apply only a frequency-direction gradient magnetic field and a phase-direction gradient magnetic field. When the gradient amplifier 220 applies only a frequency-direction gradient magnetic field and a phase-direction gradient magnetic field, the RF transmitter 210 may transmit the RF signal including a phase shift for spatial encoding in a slice direction. The 3D spatial encoding may be performed based on the frequency-direction gradient magnetic field, the phase-direction gradient magnetic field, and the phase of the RF signal.

The RF receiver 230 receives MR signals in an overlapped state from each of the multiple slices in a same TR period. The multiple slices of the object may be excited by the RF signal to emit MR signals, and the RF receiver 230 may receive the MR signals emitted by the multiple slices. For example, the RF receiver 230 may receive the MR signals emitted by the multiple slices, and the MR signals are received in an overlapped state in a same TR period.

The RF receiver 230 may include multiple channels and receive the MR signal from multiple coils. The multiple coils may include a multi-channel receive coil. For example, the multiple coils may include an RF coil of various channels, such as 16 channels, 32 channels, 72 channels, 144 channels, and so on.

The RF receiver 230 may acquire additional calibration data by the multiple coils to distinguish the MR signals acquired in the overlapped state. The MR signals acquired in the overlapped state by the multiple coils may be distinguished based on the sensitivity difference between the multiple coils.

The RF receiver 230 may under-sample and acquire the MR signal. The under-sampling may refer to acquiring MR signals only in some TR periods instead of acquiring MR signals in all TR periods.

The image processor 240 may generate 3D k-space data based on the acquired MR signal. For example, the image processor 240 may acquire 3D k-space data by performing 3D spatial encoding on the acquired MR signal. The performing 3D spatial encoding on the MR signal may refer to arranging digital data about the MR signal in the k-space data of the memory. When the RF receiver 230 undersamples and acquires the MR signal, the image processor 240 may acquire under-sampled k-space data.

The image processor 240 may acquire an MR image of each of the multiple slices based on the generated 3D k-space data. For example, the image processor 240 may perform 3D Fourier transformation on the acquired 3D k-space data to acquire the MR image.

The image processor 240 may acquire the MR image of each of the multiple slices based on the MR signal in the overlapped state by using at least one of parallel imaging and compressed sensing.

The parallel imaging may include a SENSE method. For example, the parallel imaging may refer to simultaneously exciting the multiple slices to simultaneously acquire MR signals from the multiple slices by the multiple coils, and by using the coil sensitivity information difference between the multiple slices to separate the MR signal of each of the multiple slices.

The parallel imaging may include a GRAPPA method. For example, the parallel imaging may refer to simultaneously exciting the multiple slices to simultaneously acquire multiple k-space data for each of the multiple slices, and interpolating the multiple k-space data to acquire MR signals about each of the multiple slices. The compressed sensing may refer to reconstructing an MR image after acquiring signals only for some grids instead of acquiring signals for all grids of the k-space data. The compressed sensing may be embodied by under-sampling.

Figure 3:
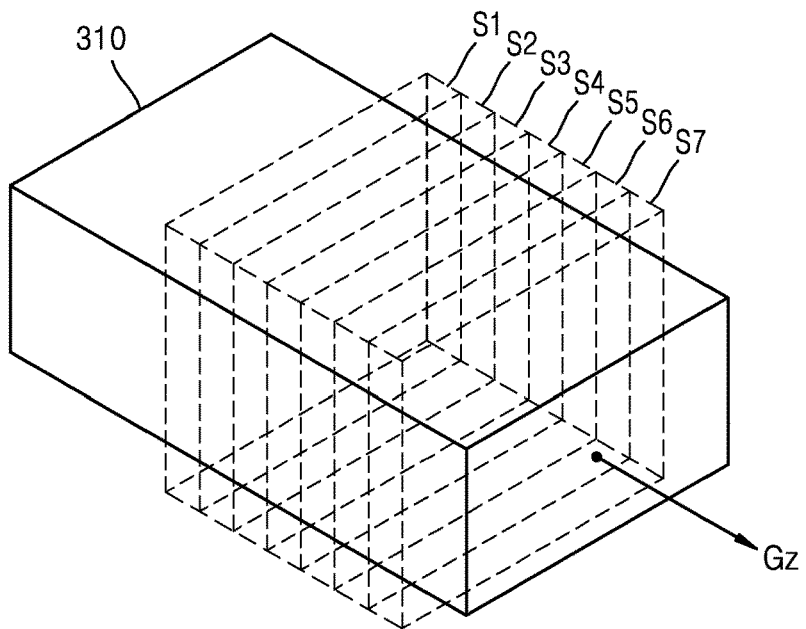
FIG. 3 is a diagram illustrating excitation of multiple slices of an object.

FIG. 3 is a diagram illustrating excitation of multiple slices of an object.

Referring to FIG. 3, a 3D volume 310 of the object includes first to seventh slices S1, S2, S3, S4, S5, S6, and S7. In the 3D volume 310 of the object, the slices S1 to S7 may be arranged in a slice direction Gz. Although only seven slices are illustrated in the 3D volume 310 of the object, exemplary embodiments are not limited thereto.

In order to image a certain slice of the object, the RF transmitter 210 may excite a certain slice (e.g., the first slice S1) among the slices S1 to S7. The excitation may mean the transition to a high energy state of magnetized nucleuses by absorbing RF energy when an RF signal is transmitted to the magnetized nucleuses. The excitation of the slice may mean the transition from a low energy state to a high energy state of nucleuses included in the slice.

The multiple slices may be some of the slices constituting the 3D volume of the object. The multiple slices may be adjacent to each other or may be separate from each other. The excitation of the multiple slices may mean the excitation of the first slice S1 and the second slice S2, the excitation of the first slice S1 and the third slice S3, etc.

In order to reduce the imaging time for the multiple slices, the RF transmitter 210 may excite the multiple slices simultaneously. For example, the RF transmitter 210 may excite the first slice S1 and the third slice S3 simultaneously.

The RF transmitter 210 may transmit an RF signal including multiple frequency signals corresponding respectively to the multiple slices to excite the multiple slices. For example, when the RF signal includes a first frequency signal and a second frequency signal, the first frequency signal may excite the first slice S1 among the multiple slices and the second frequency signal may excite the second slice S2 among the multiple slices.

The RF receiver 230 may receive the MR signals in an overlapped state from each of the excited multiple slices in a same TR period. For example, if first to tenth TR periods exist, when the MR signal of the first slice S1 is received in the first, third, fifth, seventh, and ninth TR periods, the MR signal of the second slice S2 may also be received in the first, third, fifth, seventh, and ninth TR periods.

FIG. 4 is a flowchart of an MRI method according to an exemplary embodiment. Operations of the MRI apparatus 200 will be described sequentially with reference to FIG. 4.

Referring to FIG. 4, in operation S410, the MRI apparatus 200 may transmit an RF signal including multiple frequency signals corresponding respectively to multiple slices of an object to excite the multiple slices of the object.

Since the MRI apparatus 200 according to an exemplary embodiment may excite the multiple slices simultaneously, the imaging time may be reduced.

In operation S420, the MRI apparatus 200 applies a 3D spatial encoding gradient magnetic field. According to an exemplary embodiment, the 3D spatial encoding gradient magnetic field may include a slice-direction gradient magnetic field, a frequency-direction gradient magnetic field, and a phase-direction gradient magnetic field.

The MRI apparatus 200 may apply the 3D spatial encoding gradient magnetic field so that the MR signals have linear phase in a slice direction. For example, when the MRI apparatus 200 applies the 3D spatial encoding gradient magnetic field having a linear phase to the multiple slices of the object, the MR signals emitted by the multiple slices of the object may have a linear phase in the slice direction.

Since the MRI apparatus 200 according to an exemplary embodiment may excite the multiple slices simultaneously and may perform 3D spatial encoding, the imaging time may be reduced and a signal-to-noise ratio (SNR) of the MR signals may be increased.

In operation S430, the MRI apparatus 200 receives MR signals in an overlapped state from each of the multiple slices in a same TR period.

The MRI apparatus 200 may under-sample and receive the MR signals from each of the multiple slices.

In operation S440, the MRI apparatus 200 acquires 3D k-space data based on the MR signals and acquires an MR image of each of the multiple slices based on the 3D k-space data.

FIG. 5A illustrates 3D k-space data that is acquired by full-sampling of MR signals of two slices.

FIG. 5A illustrates 3D k-space data generated by spatially encoding MR signals by using a 3D spatial encoding gradient magnetic field. The MR signals are emitted from two slices 511 and 512. As illustrated in the directions of three axes in FIG. 5A, the 3D spatial encoding may use a kz-direction gradient, a kx-direction gradient, and a ky-direction gradient. In an exemplary embodiment, kx, ky, and kz may respectively denote a frequency direction, a phase direction, and a slice direction; however, exemplary embodiments are not limited thereto.

The full-sampled k-space data of FIG. 5A represents a result that the MR signals are sampled when the ky-direction gradient magnetic field is continuously changed with respect to two slices 511 and 512. Points indicated in the 3D k-space data of FIG. 5A indicate that MR signals are acquired in each TR period. Also, each point indicated in FIG. 5A represents a line extending in the kx direction, because the kx-direction gradient is applied to the object in a signal acquisition period for acquiring MR signals.

When MR signals are acquired in an under-sampling mode, k-space data including an acquired line and an unacquired line may be acquired.

FIG. 5B is a diagram illustrating an exemplary embodiment of cross-sampling that is a type of under-sampling.

FIG. 5B illustrates cross-sampled k-space data that is acquired by cross-sampling of MR signals of two slices. The cross-sampled k-space data represents a result of sampling MR signals of two slices 521 and 522 sequentially and alternately between two slices 521 and 522. It is illustrated that the cross-sampled k-space data includes acquired lines 525 and unacquired lines 526 for the first slice 521. The MR signals 527 of the second slice 522 are acquired in a TR period corresponding to the unacquired lines 526.

The number of acquired lines of the cross-sampled k-space data may be half of the number of acquired lines of the full-sampled k-space data as illustrated FIGS. 5A 5B. Thus, the acquisition of the full-sampled k-space data may need twice as much time as the acquisition of the cross-sampled k-space data.

FIG. 5C is a diagram illustrating an exemplary embodiment of random-sampling that is a type of under-sampling.

FIG. 5C illustrates random-sampled k-space data that is acquired by random-sampling of MR signals of two slices. The random-sampled k-space data represents a result of sampling MR signals of two slices randomly and alternately between two slices. For example, the random-sampled k-space data represents acquired lines 531, an unacquired line 532, and an acquired line 533 for the first slice 521 in random order. The MR signals 534 of the second slice 522 are acquired in a TR period corresponding to the unacquired lines of the first slice, e.g., the unacquired line 532.

The MRI apparatus 200 according to an exemplary embodiment may interpolate under-sampled k-space data by using calibration data acquired through multiple coils, as described below in detail with reference to FIG. 9.

Figure 6A:
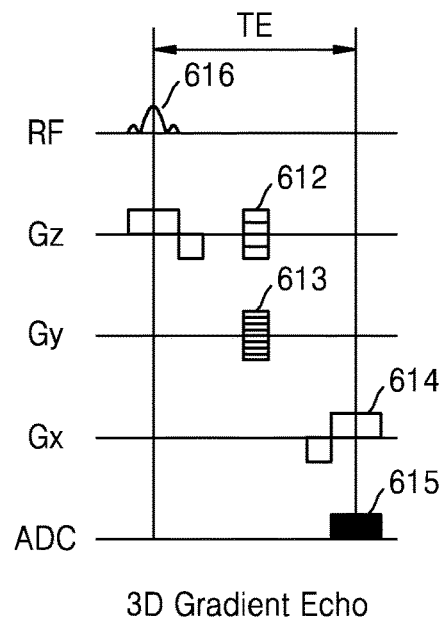
FIG. 6A illustrates a pulse sequence schematic diagram of a 3D gradient echo (GRE) mode.

FIG. 6A illustrates a pulse sequence schematic diagram of a 3D gradient echo (GRE) mode. FIG. 6A illustrates that 3D encoding may be applied in a GRE mode.

Referring to FIG. 6A, the MRI apparatus 200 may transmit an RF signal 616, and may gradually modulate and apply a gradient 612 in a slice direction Gz in each TR period in a signal transmission period in which the RF signal 616 is transmitted. For example, the intensity of the gradient 612 in the slice direction Gz may be gradually increased in each TR period.

The MRI apparatus 200 may gradually modulate and apply a 613 in a phase direction Gy in each TR period before MR signals are acquired. For example, the intensity of the gradient 613 in the phase direction Gy may be gradually increased in each TR period.

The MRI apparatus 200 may apply a gradient 614 in a frequency direction Gx in a signal acquisition period in which MR signals are acquired.

A digital MR signal 615 may be an MR signal that is acquired through an analog-to-digital converter (ADC) in a signal acquisition period.

The number of times that the intensity of a slice-direction gradient is gradually modulated may be equal to the number of times of slice-direction spatial encoding. The slice-direction spatial encoding is encoding by the slice-direction gradient. When the number of times of slice-direction spatial encoding is more than the number of the multiple slices, aliasing of the MR image may be decreased. The aliasing may refer to a staircase effect that an image contour is not smooth.

Figure 6B:
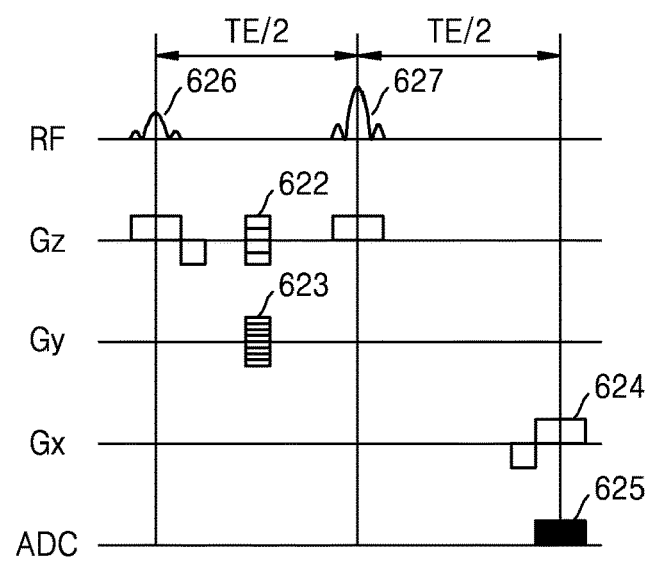
FIG. 6B illustrates a pulse sequence schematic diagram of a 3D spin echo (SE) mode.

FIG. 6B illustrates a pulse sequence schematic diagram of a 3D spin echo (SE) mode. FIG. 6B illustrates that 3D encoding may be applied in an SE mode.

Referring to FIG. 6B, the MRI apparatus 200 may transmit a 90-degree RF signal 626, and may gradually modulate and apply a gradient 622 in the slice direction Gz to the object in each TR period in a signal transmission period in which the 90-degree RF signal 626 is transmitted. For example, the intensity of the gradient 622 in the slice direction Gz may be gradually increased in each TR period.

The MRI apparatus 200 may gradually modulate and apply a gradient 623 in the phase direction Gy to the object in each TR period before MR signals are acquired. For example, the intensity of the gradient 623 in the phase direction Gy may be gradually increased in each TR period.

The MRI apparatus 200 may transmit a 180-degree RF signal 627, and may gradually modulate and apply a gradient 622 in the slice direction Gz to the object in each TR period in a signal transmission period in which the 180-degree RF signal 627 is transmitted.

The MRI apparatus 200 may apply a gradient magnetic field 624 of the frequency direction Gx in a signal acquisition period in which MR signals are acquired.

A digital MR signal 625 may be an MR signal that is acquired through an ADC in a signal acquisition period.

Although the GRE mode and the SE mode are illustrated as exemplary embodiments of the 3D spatial encoding of MR signals in FIGS. 6A and 6B, the exemplary embodiments of the 3D spatial encoding are not limited to the GRE mode and the SE mode.

The MRI apparatus 200 according to an exemplary embodiment may minimize the degradation of MR signals by adjusting an order of applying the slice-direction gradients 612 and 622 and the phase-direction gradients 613 and 623 to the object. For example, in FIG. 6A, the MRI apparatus 200 may first apply the slice-direction gradient to the object and then apply the phase-direction gradient to the object, and may also apply the slice-direction gradient and the phase-direction gradient in reverse order.

The pulse sequence schematic diagrams of FIGS. 6A and 6B illustrate a case where the phase-direction gradients 613 and 623 and the slice-direction gradients 612 and 622 are not applied to the object in the signal acquisition period in which the RF receiver 230 detects the MR signals. Referring to FIGS. 6A and 6B, the intensities of the phase-direction gradients 613 and 623 and the slice-direction gradients 612 and 622 are 0 in the signal acquisition period. Referring to FIGS. 6A and 6B, the phase-direction gradients 613 and 623 and the slice-direction gradients 612 and 622 are applied to the object before the signal acquisition period in each TR period, and only the frequency-direction gradients 614 and 624 are applied to the object in the signal acquisition period.

The MRI apparatus 200 according to another exemplary embodiment may achieve additional acceleration of acquisition of an MR image by changing the intensity of at least one of the slice-direction gradient and the phase-direction gradient in the signal acquisition period. For example, at least one of the slice-direction gradient and the phase-direction gradient may be oscillated and applied to the object in the signal acquisition period.

Figure 7:
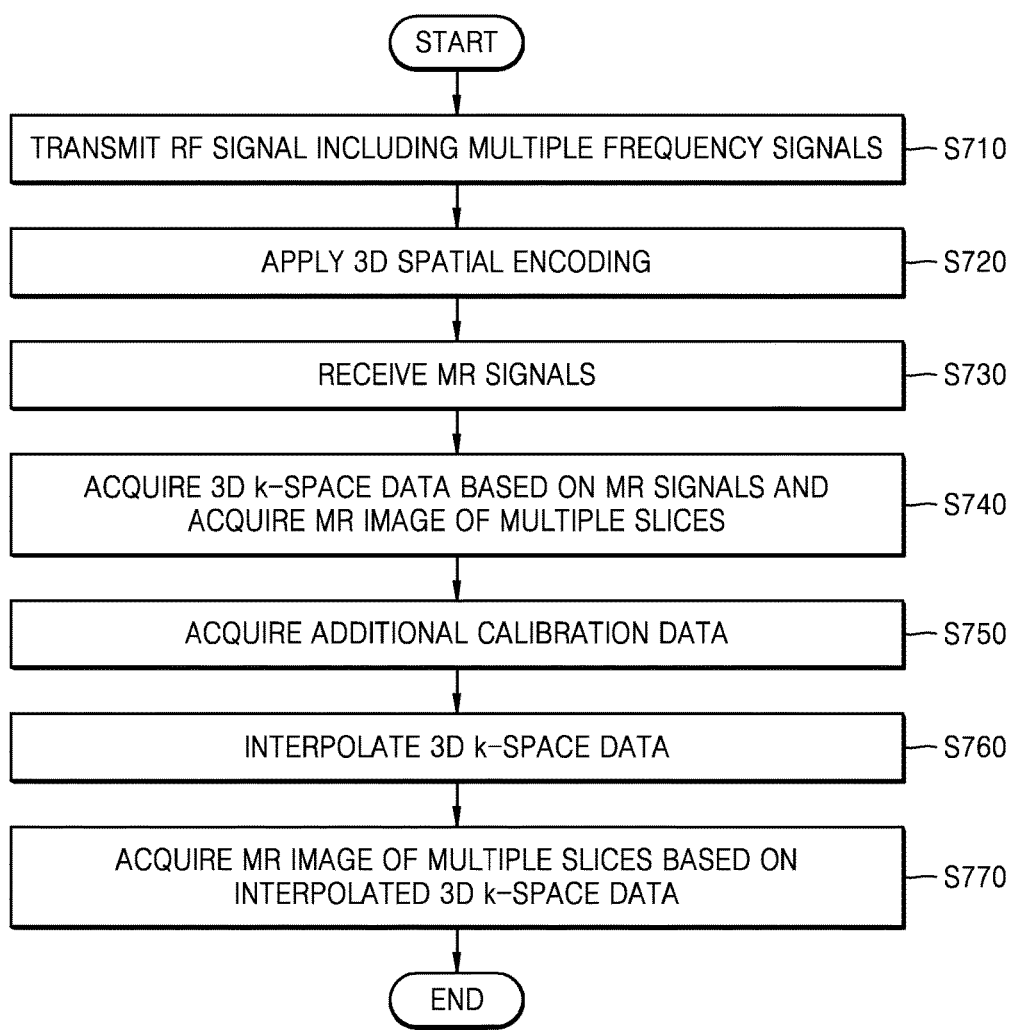
FIG. 7 is a flowchart of an MRI method according to an exemplary embodiment.

FIG. 7 is a flowchart of an MRI method according to an exemplary embodiment.

Operations of the MRI apparatus 200 will be described with reference to FIG. 7.

Operations S710, S720, and S730 of FIG. 7 correspond respectively to operations S410, S420, and S430 of FIG. 4. Redundant descriptions will be omitted.

Referring to FIG. 7, in operation S710, the MRI apparatus 200 may transmit an RF signal including multiple frequency signals corresponding respectively to multiple slices of an object to excite the multiple slices of the object.

In operation S720, the MRI apparatus 200 may apply a 3D spatial encoding gradient magnetic field.

In operation S730, the MRI apparatus 200 may receive MR signals in an overlapped state from each of the multiple slices in a same TR period.

In operation S740, the MRI apparatus 200 may acquire 3D k-space data based on the MR signals. When the MRI apparatus 200 under-samples and receives the MR signals, under-sampled 3D k-space data including an acquired line and an unacquired line may be acquired.

In operation S750, the MRI apparatus 200 may acquire additional calibration data for interpolating the under-sampled 3D k-space data.

According to an exemplary embodiment, the MRI apparatus 200 may additionally excite each of the multiple slices and acquire additional calibration data based on the MR signals of each of the additionally-excited multiple slices. For example, the MRI apparatus 200 may acquire additional calibration data by additionally exciting the first slice to acquire an MR signal of the first slice and by additionally exciting the second slice to acquire an MR signal of the second slice.

According to another exemplary embodiment, the MRI apparatus 200 may acquire additional calibration data based on the MR signals of the simultaneously-excited multiple slices.

In operation S760, the MRI apparatus 200 may interpolate the 3D k-space data by using the calibration data. For example, the MRI apparatus 200 may estimate the unacquired line by using the calibration data in order to interpolate the 3D k-space data. The MRI apparatus 200 may estimate the unacquired line by using the calibration data and the acquired line in order to interpolate the 3D k-space data.

In operation S770, the MRI apparatus 200 may acquire an MR image of each of the multiple slices based on the interpolated 3D k-space data. For example, the MRI apparatus 200 may acquire an MR image of each of the multiple slices by performing 3D Fourier transformation on the interpolated 3D k-space data.

Figure 8A:
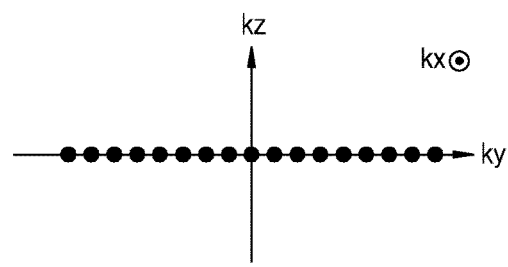
FIGS. 8A, 8B, and 8C are diagrams illustrating acquisition of additional calibration data according to an exemplary embodiment.
Figure 8B:
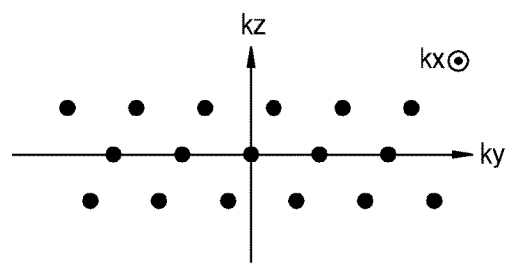

FIGS. 8A and 8B illustrate acquisition of additional calibration data according to an exemplary embodiment.

Figure 8C:
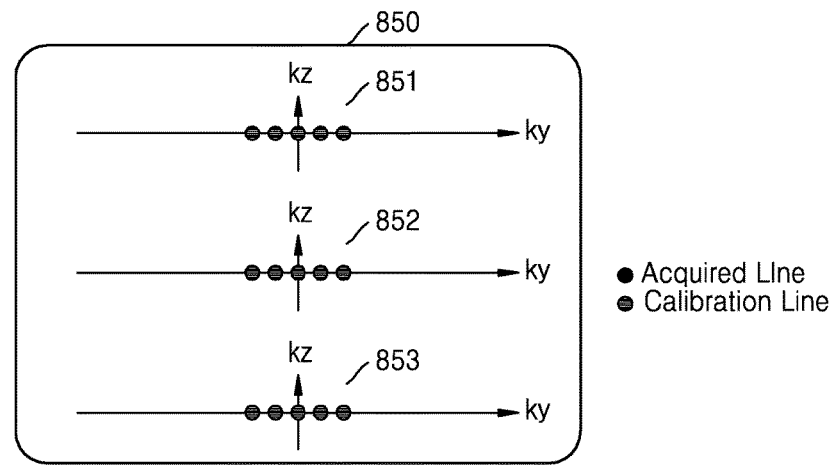

FIGS. 8A and 8B illustrate 3D k-space data acquired by using MR signals in overlapped state from multiple slices. FIG. 8C illustrates k-space data 851, 852, and 853 generated by acquiring an additional signal from each slice in order to interpolate the k-space data of FIG. 8A or 8B.

As described in detail below, the Controlled Aliasing In Parallel Imaging Results IN Higher Acceleration (CAIPIRINHA) used in parallel imaging of an exemplary embodiment modifies the appearance of aliasing artifacts during data acquisition in order to improve the subsequent parallel imaging reconstruction procedure.

FIG. 8A illustrates k-space data acquired from MR signals of multiple slices by a non-CAIPIRINHA mode. Referring to FIG. 8A, black points represent acquired lines where MR signals are acquired, and each of the black points represents a line extending in a kx direction. In the non-CAIPIRINHA mode, since the acquired lines may be aligned overlappingly along a ky direction, it may be more difficult to discriminate the signals of the multiple slices, in comparison with FIG. 8B.

FIG. 8B illustrates k-space data acquired from MR signals of multiple slices in a CAIPIRINHA mode. The CAIPIRINHA mode may refer to operating an aliasing pattern to be advantageous for parallel imaging. For example, the acquired lines of the k-space data of FIG. 8B are distributed widely in the slice direction kz, in comparison with the acquired lines of the k-space data of FIG. 8A. In the CAIPIRINHA mode, since the acquired lines are distributed widely in the slice direction, it may be easier to discriminate the signals of the multiple slices than the non-CAIPIRINHA mode of FIG. 8A.

The MRI apparatus 200 may acquire additional calibration data in order to distinguish the signals of each slice among overlapped MR signals. FIG. 8C illustrates 3D k-space data 851, 852, and 853 acquired by full-sampling on each slice in order to acquire additional calibration data. For example, the MRI apparatus 200 may additionally excite each of the multiple slices in order to acquire additional calibration data. The MRI apparatus 200 may acquire 3D k-space data 851, 852, and 853 from each of the excited multiple slices and the acquired data may be used as additional calibration data.

The multiple slices may be simultaneously excited to acquire additional calibration data.

FIGS. 9A and 9B are diagrams illustrating acquisition of additional calibration data according to another exemplary embodiment.

With reference to FIGS. 9A and 9B, the MRI apparatus 200 simultaneously excites multiple slices to acquire 3D k-space data through multiple coils, and interpolates the 3D k-space data by using calibration data acquired from the multiple coils.

FIGS. 9A and 9B illustrate 3D k-space data interpolated by using additional calibration data acquired based on an MR signal acquired from simultaneously excited multiple slices.

In FIGS. 9A and 9B, each of black points represents a line extending in a frequency direction kx. Also, acquired lines illustrated by black points may represent MR signals detected in a signal acquisition period. Also, unacquired lines illustrated by white points may represent undetected MR signals. The MR signal corresponding to the unacquired line may be an MR signal that would have been detected in the full-sampling mode but is not detected in the under-sampling mode. The calibration lines are illustrated by gray points, and may represent MR signals that are additionally acquired by the MRI apparatus 200 by using calibration data. The calibration line may be used to estimate the unacquired line for interpolating the 3D k-space data. Under-sampled k-space data may be interpolated by using calibration data and then converted into full-sampled k-space data.

FIG. 9A illustrates 3D k-space data acquired in a non-CAIPIRINHA mode. Referring to FIG. 9A, an acquired line and a calibration line of the 3D k-space data are combined together, and all lines in a box 911 are sampled.

FIG. 9B illustrates 3D k-space data acquired in a CAIPIRINHA mode.

Referring to FIG. 9B, an acquired line and a calibration line of the 3D k-space data are combined together, and all lines in a box 921 are sampled.

According to the exemplary embodiment illustrated in FIG. 9B, the MRI apparatus 200 does not perform an additional scan for acquiring additional calibration data. For example, the MRI apparatus 200 may acquire calibration data in the main scan process corresponding to operations S710 to S730 of FIG. 7. For example, the additional calibration data may be acquired through the multiple coils in the main scan process.

According to another exemplary embodiment, the MRI apparatus 200 may acquire the calibration data in a process as a portion of the main scan process. The acquisition of the calibration data in the process as the portion of the main scan process may be performed using both the SMS mode and the 3D spatial encoding.

According to an exemplary embodiment, the MRI apparatus 200 may employ the GRAPPA mode. For example, the MRI apparatus 200 may acquire under-sampled multiple k-space data from each of the multiple coils and interpolate the multiple k-space data by using additional calibration data. The MRI apparatus 200 may acquire MR images for each of the multiple coils by using the interpolated multiple k-space data. The MRI apparatus 200 may synthesize a final image based on the MR images for each of the multiple coils.

According to another exemplary embodiment, the MRI apparatus 200 may employ the SENSE mode. For example, the MRI apparatus 200 may acquire sensitivity information about each of the multiple coils by using additional calibration data and acquire MR images by using the sensitivity information about each of the multiple coils.

Since the MRI apparatus 200 according to an exemplary embodiment may minimize the movement difference of the object between the data acquired in the main scan process and the calibration data, a more stable image may be acquired. Since the MRI apparatus 200 does not need to perform an additional calibration scan in order to acquire the calibration data, the acquisition time point of the data acquired in the main scan process and acquisition time point of the calibration data are identical to each other so the movement of the object may be minimized.

Also, since the MRI apparatus 200 according to an exemplary embodiment employs the 3D encoding method, the SNR of the MR signals may be increased. The MRI apparatus 200 may employ both the non-CAIPIRINHA mode and the CAIPIRINHA mode. The MRI apparatus 200 may employ the GRAPPA mode and the SENSE mode.

The above exemplary embodiments may be written as a program and may be implemented in a computer that executes the program by using a computer-readable recording medium.

Examples of the computer-readable recording medium include magnetic storage media (e.g., ROMs, floppy disks, hard disks, etc.), optical recording media (e.g., CD-ROMs, DVDs, etc.), and transmission media such as Internet transmission media.

The foregoing exemplary embodiments and advantages are merely exemplary and are not to be construed as limiting. The present teaching may be readily applied to other types of apparatuses. The description of the exemplary embodiments is intended to be illustrative, and not to limit the scope of the claims, and many alternatives, modifications, and variations will be apparent to those skilled in the art.

What is claimed is:
1. A magnetic resonance imaging (MRI) apparatus comprising:
a radio frequency (RF) transmitter configured to transmit an RF signal including multiple frequency signals corresponding respectively to different multiple slices, including a first slice and a second slice, of an object to excite the multiple slices of the object;

a gradient amplifier configured to apply a three-dimensional (3D) spatial encoding;

an RF receiver configured to receive MR signals in an overlapped state from the multiple slices in a same repetition time (TR) period by using multiple coils; and an image processor configured to acquire 3D k-space data by acquiring k-space data of the first slice and calibration data of the second slice together based on the MR signals received in the same TR period by using the multiple coils, and acquire an MR image of each of the multiple slices based the 3D k-space data.

2. The MRI apparatus of claim 1, wherein the gradient amplifier is configured to apply a slice-direction gradient in a slice direction in which the multiple slices of the object are arranged, a frequency-direction gradient in a frequency encoding direction, and a phase-direction gradient in a phase encoding direction.

3. The MRI apparatus of claim 2, wherein the gradient amplifier is configured to not apply the phase-direction gradient in a signal acquisition period for acquiring the MR signals.

4. The MRI apparatus of claim 2, wherein the gradient amplifier is configured to not apply the slice-direction gradient in a signal acquisition period for acquiring the MR signals.

5. The MRI apparatus of claim 2, wherein the gradient amplifier is configured to apply at least one of the slice-direction gradient and the phase-direction gradient in a signal acquisition period for acquiring the MR signals.

6. The MRI apparatus of claim 2, wherein the gradient amplifier is configured to determine a sequence order of applying the slice-direction gradient and the phase-direction gradient.

7. The MRI apparatus of claim 2, wherein a number of times of encoding the MR signals by the slice-direction gradient is more than a number of the multiple slices.

8. The MRI apparatus of claim 1, wherein the RF receiver is configured to acquire additional calibration data from the object by using the multiple coils, and the image processor is configured to acquire the MR image based on the additional calibration data and the 3D k-space data.

9. The MRI apparatus of claim 8, wherein the additional calibration data is acquired based on the MR signals received in the overlapped state in the same TR period.

10. The MRI apparatus of claim 8, wherein the additional calibration data is acquired based on the MR signals from the multiple slices that are additionally excited.

11. The MRI apparatus of claim 8, wherein the RF receiver is configured to perform under-sampling and acquire the MR signals from the multiple coils.

12. The MRI apparatus of claim 8, wherein the image processor is configured to interpolate multiple pieces of k-space data acquired respectively by each of the multiple coils by using the additional calibration data, and acquire the MR image for each of the multiple coils based on the interpolated multiple pieces of k-space data.

13. The MRI apparatus of claim 8, wherein the image processor is configured to acquire sensitivity information about each of the multiple coils by using the additional calibration data, and acquire the MR image by using the sensitivity information.

14. The MRI apparatus of claim 1, wherein the gradient amplifier is configured to apply the 3D spatial encoding so that the MR signals have linear phase in a slice direction in which the multiple slices of the object are arranged.

15. The MRI apparatus of claim 1, wherein the image processor is configured to acquire the MR image of the multiple slices based on the MR signals in the overlapped state by using at least one of parallel imaging and compressed sensing.

16. A magnetic resonance imaging (MRI) apparatus comprising:

a radio frequency (RF) transmitter configured to transmit an RF signal including multiple frequency signals corresponding respectively to different multiple slices, including a first slice and a second slice, of an object, to excite the multiple slices of the object;

a gradient amplifier configured to apply a gradient magnetic field by applying a frequency-direction gradient in a frequency encoding direction and a phase-direction gradient in a phase encoding direction, for spatial encoding;

an RF receiver configured to receive MR signals in an overlapped state from the multiple slices in a same repetition time (TR) period by using multiple coils; and an image processor configured to acquire 3D k-space data by acquiring k-space data of the first slice and calibration data of the second slice together based on the MR signals received in the same TR period by using the multiple coils, and acquire an MR image of each of the multiple slices based on the 3D k-space data, wherein the RF signal includes a phase shift for the spatial encoding in a slice direction in which the multiple slices of the object are arranged.

17. A magnetic resonance imaging (MRI) method comprising:

transmitting a radio frequency (RF) signal including multiple frequency signals corresponding respectively to different multiple slices, including a first slice and a second slice, of an object, to excite the multiple slices of the object;

applying a three-dimensional (3D) spatial encoding;

receiving MR signals in an overlapped state from the multiple slices in a same repetition time (TR) period by using multiple coils;

acquiring 3D k-space data by acquiring k-space data of the first slice and calibration data of the second slice together based on the MR signals received in the same TR period by using the multiple coils based on the MR signals; and acquiring an MR image of each of the multiple slices based on the 3D k-space data.

18. The MRI method of claim 17, wherein the applying the 3D spatial encoding comprises:

applying a slice-direction gradient in a slice direction in which the multiple slices are arranged;

applying a frequency-direction gradient in a frequency encoding direction; and applying a phase-direction gradient in a phase encoding direction.

19. The MRI method of claim 18, wherein the applying the 3D spatial encoding comprises not applying the phase-direction gradient in a signal acquisition period for acquiring the MR signals.

20. The MRI method of claim 18, wherein the applying the 3D spatial encoding comprises not applying the slice-direction gradient in a signal acquisition period for acquiring the MR signals.

21. The MRI method of claim 18, wherein the applying the 3D spatial encoding comprises:

applying at least one of the slice-direction gradient and the phase-direction gradient in a signal acquisition period for acquiring the MR signals.

22. The MRI method of claim 18, wherein the applying the 3D spatial encoding comprises:
determining a sequence order of applying the slice-direction gradient and the phase-direction gradient.

23. The MRI method of claim 18, wherein a number of times of encoding the MR signals by the slice-direction gradient is more than a number of the multiple slices.

24. The MRI method of claim 17, wherein the acquiring the MR image comprises:
acquiring additional calibration data from the object by using the multiple coils; and
acquiring the MR image based on the additional calibration data and the 3D k-space data.

25. The MRI method of claim 24, wherein the acquiring the additional calibration data comprises:
acquiring the additional calibration data based on the MR signals that are received in the overlapped state in the same TR period.

26. The MRI method of claim 24, wherein the acquiring the additional calibration data comprises:
additionally exciting the multiple slices to acquire the additional calibration data; and
acquiring the additional calibration data based on the MR signals from each of the additionally excited multiple slices.

27. The MRI method of claim 24, wherein the receiving the MR signals comprises:
performing under-sampling and receiving the MR signals from the multiple coils.

28. The MRI method of claim 24, wherein the acquiring the MR image comprises:
interpolating multiple pieces of k-space data acquired respectively by each of the multiple coils by using the additional calibration data; and
acquiring the MR image for each of the multiple coils based on the interpolated multiple pieces of k-space data.

29. The MRI method of claim 24, wherein the acquiring the MR image comprises:
acquiring sensitivity information about each of the multiple coils by using the additional calibration data; and
acquiring the MR image by using the sensitivity information.

30. The MRI method of claim 17, wherein the applying the 3D spatial encoding comprises:
applying the 3D spatial encoding so that the MR signals have linear phase in a slice direction in which the multiple slices of the object are arranged.

31. The MRI method of claim 17, wherein the acquiring the MR image comprises:
acquiring the MR image of each of the multiple slices based on the MR signals in the overlapped state by using at least one of parallel imaging and compressed sensing.

32. A non-transitory computer-readable recording medium that stores a program that, when executed by a computer, causes the computer to perform the MRI method of claim 17.

* * * * *